(12) United States Patent
Song et al.

(10) Patent No.: US 10,276,760 B2
(45) Date of Patent: Apr. 30, 2019

(54) LIGHT EMITTING DIODE

(71) Applicant: Seoul Semiconductor Co., Ltd., Ansan-si (KR)

(72) Inventors: Jae Wan Song, Ansan-si (KR); Jae Hyun Park, Ansan-si (KR); So Mi Park, Ansan-si (KR); Ki Bum Nam, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/198,957

(22) Filed: Jun. 30, 2016

(65) Prior Publication Data
US 2017/0025590 A1    Jan. 26, 2017

(30) Foreign Application Priority Data

Jun. 30, 2015 (KR) .................. 10-2015-0093540

(51) Int. Cl.
*H01L 33/00* (2010.01)
*H01L 33/50* (2010.01)
(Continued)

(52) U.S. Cl.
CPC .............. *H01L 33/56* (2013.01); *H01L 33/36* (2013.01); *H01L 33/38* (2013.01); *H01L 33/501* (2013.01);
(Continued)

(58) Field of Classification Search
CPC ......... H01L 33/52; H01L 33/54; H01L 33/56; H01L 33/58; H01L 33/38; H01L 33/501; H01L 33/505
(Continued)

(56) References Cited

U.S. PATENT DOCUMENTS 7,344,902 B2   3/2008  Basin et al.
8,168,998 B2   5/2012  David et al.
(Continued)

FOREIGN PATENT DOCUMENTS

JP   2008-47851    2/2008
JP   2011-187929   9/2011
(Continued)

OTHER PUBLICATIONS

Non-Final Office Action dated Dec. 15, 2017, in U.S. Appl. No. 15/673,372.
(Continued)

*Primary Examiner* — Dao H Nguyen
(74) *Attorney, Agent, or Firm* — H.C. Park & Associates, PLC (57) ABSTRACT

Disclosed herein is a light emitting diode. The light emitting diode includes: a light emitting diode chip; a first molding portion covering the light emitting diode chip and having a first index of refraction; a second molding portion covering the first molding portion and having a second index of refraction, wherein the second index of refraction is not higher than the first index of refraction. The light emitting diode chip is covered by a molding portion having a high index of refraction and a molding portion having a low index of refraction and covering the molding portion having a high index of refraction in order to reduce total reflection in the molding portions through reduction in difference in index of refraction between external air and the molding portion having a high index of refraction, thereby improving quantity of light.

13 Claims, 5 Drawing Sheets

(51) Int. Cl.
*H01L 33/58* (2010.01)
*H01L 21/00* (2006.01)
*H01L 33/56* (2010.01)
*H01L 33/36* (2010.01)
*H01L 33/52* (2010.01)
*H01L 33/38* (2010.01)
*H01L 33/54* (2010.01)

(52) U.S. Cl.
CPC .............. *H01L 33/52* (2013.01); *H01L 33/54* (2013.01); *H01L 33/505* (2013.01); *H01L 33/58* (2013.01)

(58) Field of Classification Search
USPC ......... 257/88, 89, 98, 99, E33.056, E33.059, 257/E33.072, E33.073; 313/498, 506, 313/512; 362/97.1, 311.02; 438/22, 26, 438/27, 29
See application file for complete search history.

(56) References Cited

U.S. PATENT DOCUMENTS

| | | | |
|---|---|---|---|
| 8,384,105 B2 | 2/2013 | Tetz et al. | |
| 8,523,626 B2* | 9/2013 | Suehiro | H01L 33/501 313/512 |
| 8,690,395 B2* | 4/2014 | Fancsali | F21K 9/64 362/231 |
| 8,957,580 B2* | 2/2015 | Reiherzer | B29C 43/146 313/506 |
| 9,070,838 B2 | 6/2015 | Jang et al. | |
| 9,318,646 B2* | 4/2016 | Taguchi | C09K 11/025 |
| 9,761,763 B2* | 9/2017 | Steranka | H01L 33/44 |
| 2007/0012940 A1* | 1/2007 | Suh | H01L 33/507 257/99 |
| 2007/0212802 A1* | 9/2007 | Lee | H01L 33/54 438/22 |
| 2009/0236621 A1* | 9/2009 | Chakraborty | H01L 33/44 257/95 |
| 2009/0272996 A1* | 11/2009 | Chakraborty | H01L 33/501 257/98 |
| 2010/0109025 A1* | 5/2010 | Bhat | H01L 24/97 257/88 |
| 2010/0181582 A1* | 7/2010 | Li | H01L 33/44 257/91 |
| 2011/0006329 A1* | 1/2011 | Fujita | C03C 3/19 257/98 |
| 2011/0248296 A1* | 10/2011 | Choi | H01L 33/504 257/89 |
| 2012/0211781 A1* | 8/2012 | Lee | C09K 11/7734 257/89 |
| 2013/0207141 A1* | 8/2013 | Reiherzer | H01L 33/505 257/98 |
| 2015/0287893 A1* | 10/2015 | Huang | H01L 33/507 257/88 |
| 2016/0312114 A1 | 10/2016 | Murphy et al. | |

FOREIGN PATENT DOCUMENTS

| | | |
|---|---|---|
| JP | 2014-82416 | 5/2014 |
| JP | 2015-15418 | 1/2015 |
| KR | 10-2006-0124508 | 12/2006 |

OTHER PUBLICATIONS

Final Office Action dated Jun. 21, 2018, issued in U.S. Appl. No. 15/673,372.
Non-Final Office Action dated Sep. 21, 2018, in U.S. Appl. No. 15/673,372.
Final Office Action dated Feb. 14, 2019, in U.S. Appl. No. 15/673,372.

* cited by examiner

| No. | | #1(REF) | #2 | #3 | #4 | #5 | #6 | Double molding x (reference) |
|---|---|---|---|---|---|---|---|---|
| Length, Width x Height | | 1500x455 | 1500x430 | 1500x405 | 1410x455 | 1410x430 | 1410x405 | 1205x355 |
| double moding silicone thickness (μm) | Upper side | 100 | 75 | 50 | 100 | 75 | 50 | **LF about 2% ↓ as compared with REF |
| | Lateral side | 100 | 100 | 100 | 50 | 50 | 50 | |
| LF(%) | | 100.00% | 102.20% | 102.80% | 101.00% | 102.70% | 102.60% | |
| Δ CIE Y | | 0.000 | 0.002 | 0.001 | 0.002 | 0.002 | 0.000 | |
| Viewing angle | | 142 | 142~143 | 142 | 142 | 143~144 | 139 | 143~144 |

FIG. 6

LIGHT EMITTING DIODE

CROSS-REFERENCE TO RELATED APPLICATION

This application claims priority from and the benefit of Korean Patent Application No. 10-2015-0093540, filed on Jun. 30, 2015, which is hereby incorporated by reference for all purposes as if fully set forth herein.

BACKGROUND

Field

Exemplary embodiments of the present invention relate to a light emitting diode, and more particularly, to a light emitting diode including a molding portion molding a light emitting diode chip.

Discussion of the Background

A light emitting diode (LED) is an eco-friendly product with various advantages such as high luminous efficacy, long lifespan, and low power consumption. In addition, the light emitting diode can be fabricated in a package structure having a light emitting diode chip therein depending upon purposes or shapes thereof and thus has a wide application range.

In a light emitting diode package a light emitting diode chip may be mounted on a substrate and covered by a molding portion which serves to protect the light emitting diode chip. If the light emitting diode chip is a blue or UV light emitting diode chip, the light emitting diode package may employ phosphors to emit white light. The phosphors may be separately provided to the light emitting diode package or may be contained in the molding portion.

Since the molding portion serves to protect the light emitting diode chip, the molding portion may be formed to cover the light emitting diode chip. Thus, the molding portion is formed of a material having high light transmittance in order to allow light emitted from the light emitting diode chip to efficiently pass therethrough. Typically, the molding portion is formed of a silicone resin, for example, a high refractive index (HRI) silicone resin having an index of refraction of about 1.53.

In the structure wherein the phosphors are dispersed in the molding portion upon formation of the molding portion using such HRI silicone, the index of refraction of the molding portion can be further increased by the phosphors. Since the phosphors have an index of refraction of about 1.8 to 2.0, the molding portion having the phosphors dispersed therein has an index of refraction of about 1.7 or higher.

As such, in the structure wherein the light emitting diode chip is molded in the molding portion containing the phosphors, a large quantity of light emitted from the light emitting diode chip is blocked by the molding portion. This is caused by a difference in index of refraction between the molding portion and external air. That is, a higher index of refraction of the molding portion provides a greater difference in index of refraction between the molding portion and external air, thereby causing frequent occurrence of total reflection at an interface between the molding portion and the external air.

As such, the light emitting diode employing the molding portion with the phosphors dispersed therein has a problem of reduction in quantity of light.

SUMMARY

Exemplary embodiments of the present disclosure provide a light emitting diode configured to mold a light emitting diode chip using a molding portion with phosphors dispersed therein while securing a high quantity of light.

In accordance with one aspect of the present disclosure, a light emitting diode includes: a light emitting diode chip; a first molding portion covering the light emitting diode chip and having a first index of refraction; a second molding portion covering the first molding portion and having a second index of refraction, wherein the second index of refraction is not higher than the first index of refraction.

The first molding portion may cover an upper surface and a side surface of the light emitting diode chip through conformal coating, and the second molding portion may cover an upper surface and a side surface of the first molding portion through conformal coating.

The first molding portion may include phosphors, and the phosphors may include at least one selected from among one or more kinds of green phosphors, one or more kinds of cyan phosphors, one or more kinds of yellow phosphors and one or more kinds of red phosphors. In addition, the second molding portion may be formed of a transparent material free from the phosphors.

The first molding portion or the second molding portion may be formed of silicone or glass, a roughness may be formed on an upper surface or a side surface of the second molding portion, and a roughness may be formed on an upper surface or a side surface of the first molding portion.

An upper surface of the second molding portion may be composed of at least two surfaces having different inclinations. The upper surface of the second molding portion may include a curved surface.

An upper side of the first molding portion may have the same thickness as a lateral side thereof, or an upper side of the second molding portion may have the same thickness as a lateral side thereof.

Alternatively, the upper side of the second molding portion may have a different thickness than the lateral side thereof. The upper side of the second molding portion may have a smaller thickness than the lateral side thereof.

The light emitting diode chip may include a pair of electrode pads formed on a lower surface thereof.

According to exemplary embodiments, the light emitting diode includes a molding portion covering a light emitting diode chip and having a high index of refraction and another molding portion covering the molding portion and having a low index of refraction in order to reduce total reflection in the molding portions through reduction in difference in index of refraction between external air and the molding portion having a high index of refraction, thereby increasing the quantity of light emitted from the light emitting diode.

DETAILED DESCRIPTION OF THE ILLUSTRATED EMBODIMENTS

Hereinafter, exemplary embodiments of the present disclosure will be described in detail with reference to the accompanying drawings.

Figure 1:
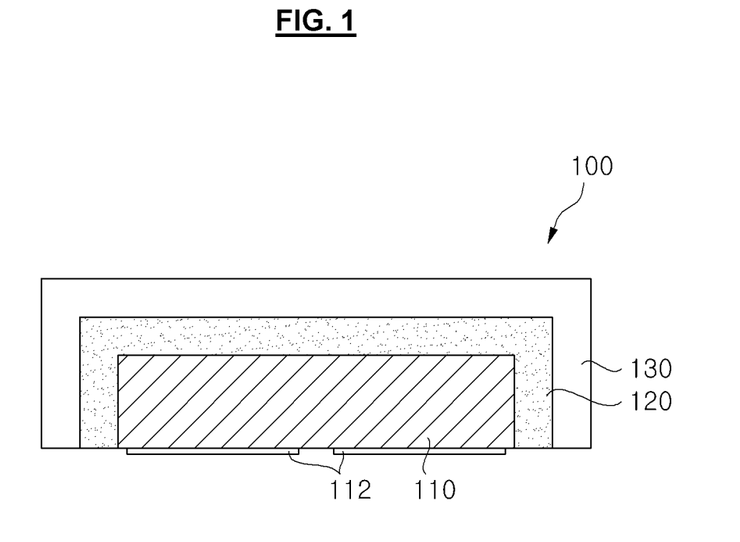
FIG. 1 is a sectional view of a light emitting diode according to one exemplary embodiment of the present disclosure.
Figure 2:
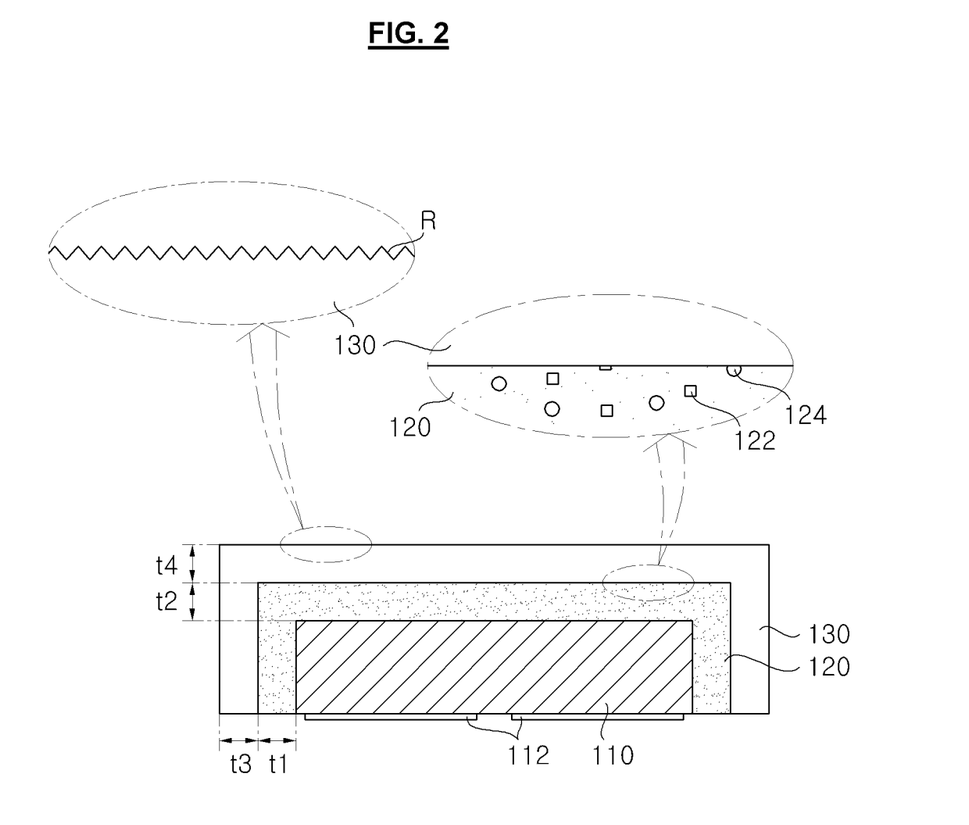
FIG. 2 is a view illustrating the light emitting diode according to the exemplary embodiment of the present disclosure.

FIG. 1 is a sectional view of a light emitting diode according to one exemplary embodiment of the present disclosure and FIG. 2 is a view illustrating the light emitting diode according to the exemplary embodiment of the present disclosure.

Referring to FIG. 1 and FIG. 2, the light emitting diode according to one exemplary embodiment includes a light emitting diode chip 110, a first molding portion 120, and a second molding portion 130.

The light emitting diode chip 110 may be mounted on a substrate (not shown) and may be configured to emit blue light or UV light. The light emitting diode may include a plurality of light emitting diode chips 110, as needed. In one exemplary embodiment, the light emitting diode chip 110 includes an n-type semiconductor layer and a p-type semiconductor layer and emits light through recombination of holes and electrons. To this end, an active layer may be interposed between the n-type semiconductor layer and the p-type semiconductor layer. The light emitting diode chip 110 may have a lateral type, a vertical type, or a flip-chip type structure.

In the structure wherein the light emitting diode chip 110 is mounted on the substrate, the light emitting diode chip 110 may be electrically connected to a plurality of conductive patterns formed on an upper surface of the substrate.

A pair of electrode pads 112 may be formed on a lower surface of the light emitting diode chip 110 to be electrically connected to the conductive patterns on the substrate. In various exemplary embodiments, the electrode pads 112 may be generally coplanar with the lower surface of the light emitting diode chip 110 and may extend in a downward direction of the light emitting diode chip 110, as shown in FIG. 1 and FIG. 2. In some exemplary embodiments, the electrode pads 112 may be placed higher than the lower surface of the light emitting diode chip 110.

The pair of electrode pads 112 may be electrically connected to the conductive patterns of the substrate such that external power can be supplied to the light emitting diode chip 110 through the electrode pads 112.

The substrate provides a mounting seat for the light emitting diode chip 110, and may be an insulation substrate or a conductive substrate. Alternatively, the substrate may be a printed circuit board having conductive patterns formed on an upper surface thereof. If the substrate is the insulation substrate, the substrate may include a polymer material or a ceramic material, for example, a ceramic material having high thermal conductivity, such as AlN. If the substrate is the PCB having conductive patterns thereon, the substrate may include a base and conductive patterns including at least two electrodes.

The first molding portion 120 is formed to cover the light emitting diode chip 110 and may include a polymer resin such as silicone or a ceramic material such as glass or alumina. In the exemplary embodiment, the first molding portion 120 is formed to cover the entirety of the light emitting diode chip 110 including a side surface thereof. That is, the first molding portion 120 may be formed to enclose the light emitting diode chip 110 through conformal coating. As a result, light emitted from the light emitting diode chip 110 can be discharged through the first molding portion 120.

As described above, the first molding portion 120 may include a transparent silicone resin or glass. In this exemplary embodiment, the first molding portion 120 is formed of a silicone resin having an index of refraction of about 1.53.

The first molding portion 120 may include one or more kinds of phosphors 122, 124. The first phosphors 122 may include at least one selected from among one or more kinds of green phosphors, one or more kinds of cyan phosphors, one or more kinds of yellow phosphors, and one or more kinds of red phosphors. By way of example, the first phosphors 122 may include garnet phosphors, aluminate phosphors, sulfide phosphors, oxynitride phosphors, nitride phosphors, fluoride phosphors, and silicate phosphors. With this structure, the light emitting diode can emit various colors through wavelength conversion of light emitted from the light emitting diode chip 110.

If the light emitting diode chip 110 is configured to emit light having a peak wavelength in a blue wavelength band, the first phosphors 122 contained in the first molding portion 120 may be selected from any kinds of phosphors capable of emitting light having a longer peak wavelength than blue light (for example, green light, red light or yellow light). Alternatively, if the light emitting diode chip 110 is configured to emit UV light, the first phosphors 122 contained in the first molding portion 120 may be selected from any kinds of phosphors capable of emitting light having a longer peak wavelength than UV light (for example, blue light, green light, red light or yellow light).

With this structure, the light emitting diode can emit white light. However, it should be understood that this structure is illustrated by way of example and other implementations are also possible. In the exemplary embodiment, the first molding portion 120 may include one or more kinds of phosphors.

As described above, the first molding portion 120 includes one or more kinds of first phosphors 122, whereby an overall index of refraction of the first molding portion 120 is increased to about 1.9 to 2.0. This is because the index of refraction of the first phosphors 122 contained in the first molding portion 120 is higher than the index of refraction of the silicon resin.

Further, in order to form the first molding portion 120 so as to cover the light emitting diode chip 110, the first molding portion 120 including one or more kinds of first phosphors 122 is deposited in a liquid phase on the light emitting diode chip 110 to cover the light emitting diode chip 110, followed by curing, grinding, and cutting. In this process, as shown in FIG. 2, the first phosphors 122 contained in the first molding portion 120 can be partially cut. As a result, when light emitted from the light emitting diode chip 110 is discharged through the partially cut first phosphors 122 while passing through the first molding portion 120, the index of refraction can be further increased.

As such, since there is a great difference in index of refraction between the first molding portion 120 including one or more kinds of first phosphors 122 and external air, the quantity of light emitted from the light emitting diode chip 110 can be reduced. Accordingly, in the exemplary embodiment, the second molding portion 130 may be formed to cover the first molding portion 120.

The second molding portion 130 may be formed of the same kind of material as the material of the first molding portion 120, and does not include the first phosphors 122 unlike the first molding portion 120. That is, the second molding portion 130 may include a polymer resin such as a transparent silicone resin, or a ceramic material such as glass or alumina. The second molding portion 130 is formed to cover the entirety of the first molding portion 120 including a side surface thereof. That is, the second molding portion 130 may be formed to enclose the first molding portion 120 through conformal coating. Accordingly, light emitted from the light emitting diode chip 110 is discharged through the second molding portion 130 via the first molding portion 120.

The second molding portion 130 is formed of a transparent silicone resin or glass and thus may have an index of refraction of about 1.53, as described above. Accordingly, light emitted from the light emitting diode chip 110 is discharged through the first molding portion 120 having an index of refraction of about 1.9 to 2.0 and the second molding portion 130 having an index of refraction of about 1.53.

In this way, since light emitted from the light emitting diode chip 110 is discharged through two molding portions having different indices of refraction, the difference in index of refraction between the molding portions and external air can be reduced, thereby further improving the quantity of light emitted through the two molding portions.

Furthermore, a roughness R may be formed on an upper surface of the second molding portion 130. The roughness R may be formed thereon by grinding the upper surface of the second molding portion 130 and serves to reduce reflection of light at an interface between the second molding portion 130 and external air due to a difference in index of refraction therebetween. Accordingly, while light emitted from the light emitting diode chip 110 is discharged through the second molding portion 130 via the first molding portion 120, the light emitting diode according to this exemplary embodiment can reduce reflection of light at the interface, thereby further improving the quantity of light emitted from the light emitting diode. In addition, the roughness R may also be formed on a side surface of the second molding portion 130 and on the first molding portion 120.

In this exemplary embodiment, a thickness t1 of a lateral side of the first molding portion 120 covering the side surface of the light emitting diode chip 110 is the same as a thickness t2 of an upper side of the first molding portion 120 covering the upper surface of the light emitting diode chip 110. In addition, a thickness t3 of a lateral side of the second molding portion 130 covering the side surface of the first molding portion 120 is the same as a thickness t4 of an upper side of the second molding portion 130 covering the upper surface of the first molding portion 120. In addition, the thickness t1 of the first molding portion 120 is the same as the thickness t3 of the second molding portion 130. By way of example, the first molding portion 120 may cover the side surface and the upper surface of the light emitting diode chip 110 with a thickness of about 100 and the second molding portion 130 may cover the side surface and the upper surface of the first molding portion 120 with a thickness of about 100 μm.

Figure 3A:
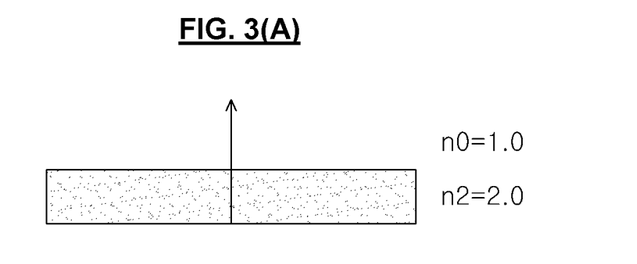
FIG. 3(A) and FIG. 3(B) are views illustrating variation in light transmittance depending upon the number of molding portions.
Figure 3B:
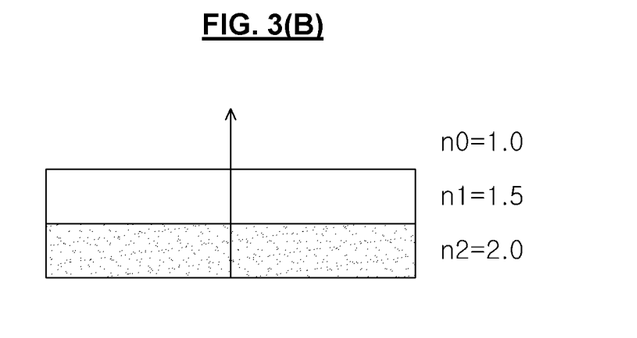

FIG. 3(A) is a view illustrating light transmittance at an interface between a medium having an index of refraction of 2.0 and air having an index of refraction of 1.0, and FIG. 3(B) is a view illustrating light transmittance at interfaces between a medium having an index of refraction of 2.0, a medium having an index of refraction of 1.5 and air having an index of refraction of 1.0.

When light travels from a medium having an index of refraction of 2.0 to air, as shown in FIG. 3(A), light transmittance can be calculated based on reflectivity at an interface between the media. Reflectivity at an interface between media having different indices of refraction can be calculated by Equation 1:

$$R(\%) = \left(\frac{n_2 - n_1}{n_2 + n_1}\right)^2 \times 100.$$

In FIG. 3(A), reflectivity at an interface between a medium (n2) and air (n0) is about 11.1% according to this equation, and thus, it can be confirmed that transmittance of light discharged from the medium (n2) is about 88.9%.

When light is discharged to air from a medium having an index of refraction of 2.0 through a medium having an index of refraction of 1.5, reflectivity at each of interfaces between the media can be calculated using the above equation as follows.

Reflectivity at an interface between a medium (n2) and a medium (n1) is about 2% and reflectivity at an interface between the medium (n1) and air (n0) is about 4%. Thus, it can be confirmed that transmittance of light discharged from the medium (n2) to air is about 94%. In this way, the light emitting diode can increase transmittance of light by decreasing the difference in index of refraction between media.

Figure 4:
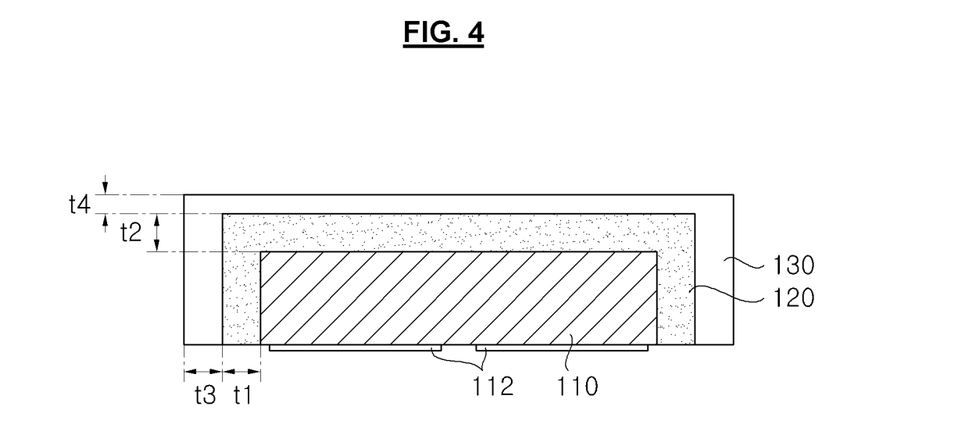
FIG. 4 is a sectional view of a light emitting diode according to another exemplary embodiment of the present disclosure.
Figure 5:
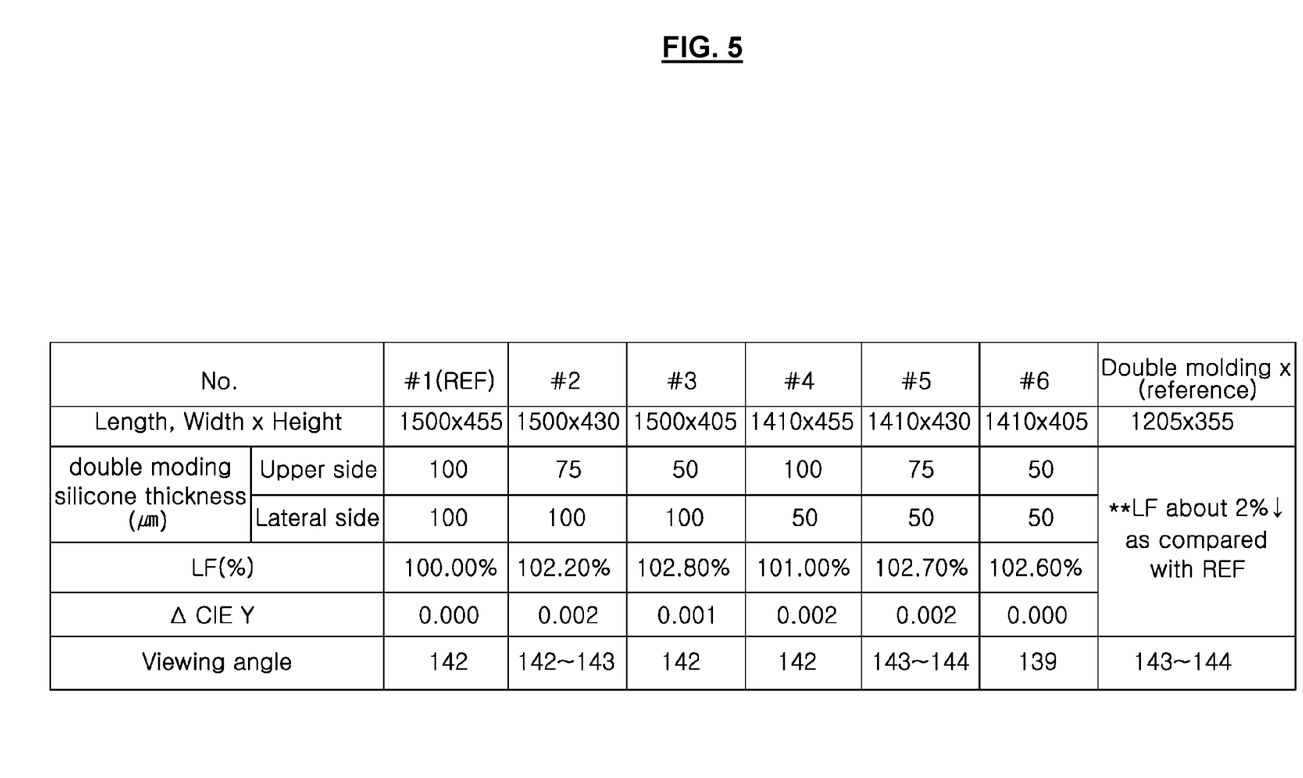
FIG. 5 shows a table of test results as to quantity of light depending upon thickness of a second molding portion.

FIG. 4 is a sectional view of a light emitting diode according to another exemplary embodiment of the present disclosure, and FIG. 5 shows a table of test results as to quantity of light depending upon thickness of a second molding portion.

Referring to FIG. 4, the light emitting diode according to this exemplary embodiment includes a light emitting diode chip 110, a first molding portion 120, and a second molding portion 130. A repeated description of the same components as those of the above exemplary embodiment will be omitted.

As shown in FIG. 4, the first molding portion 120 is formed to cover the light emitting diode chip 110 and the second molding portion 130 is formed to cover the first molding portion 120, as in the above exemplary embodiment. In this exemplary embodiment, a thickness t4 of an upper side of the second molding portion 130 covering an upper surface of the first molding portion 120 may be smaller than a thickness t3 of a lateral side of the second molding portion 130 covering a side surface of the first molding portion 120.

In FIG. 5, it can be seen that the quantity of light emitted from the light emitting diode increases with decreasing thickness t4 of the upper side of the second molding portion 130. In addition, a beam angle of light emitted from the light emitting diode varies depending upon the thickness t4 of the upper side of the second molding portion 130 such that the beam angle increases with increasing thickness thereof.

Figure 6:
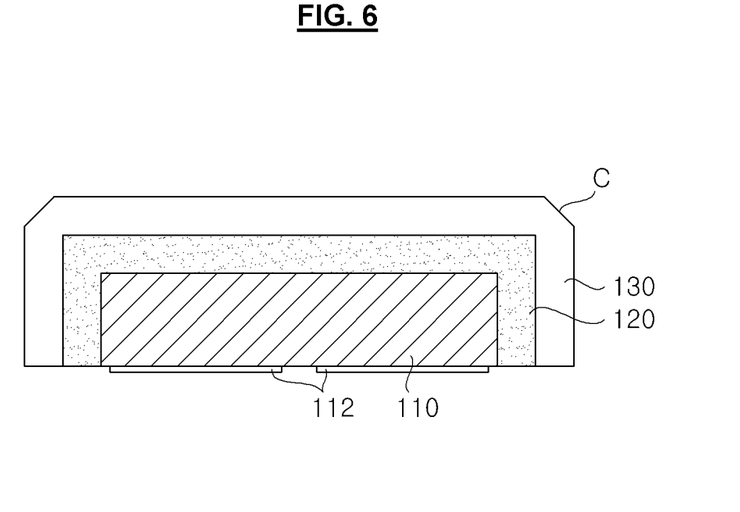
FIG. 6 is a sectional view of a light emitting diode according to a further exemplary embodiment of the present disclosure.

FIG. 6 is a sectional view of a light emitting diode according to a further exemplary embodiment of the present disclosure.

Referring to FIG. 6, the light emitting diode according to this exemplary embodiment includes a light emitting diode chip 110, a first molding portion 120, and a second molding portion 130. A repeated description of the same components as those of the above exemplary embodiment will be omitted.

The second molding portion 130 is formed to cover the first molding portion 120 and may have an inclined surface C formed by chamfering a portion or the entirety of a corner thereof. With this structure, the light emitting diode can minimize distortion of light emitted from the light emitting diode chip 110 at the corner of the second molding portion 130 while light is discharged through the second molding portion 130. That is, an upper surface of the second molding portion 130 may include a flat surface and the inclined surface C such that light traveling towards the corner of the second molding portion 130 can be discharged to the outside through the inclined surface (C). The inclined surface (C) may include a curved surface.

As such, with the structure wherein the second molding portion 130 has an inclined surface at the corner thereof, the light emitting diode can prevent reduction in quantity of light emitted through an upper corner of the second molding portion 130 and enlargement of an internal passage of light passing through the interior of the second molding portion 130. As a result, the light emitting diode can achieve uniform discharge of light through the second molding portion 130.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

The invention claimed is:

1. A light emitting diode comprising:
a light emitting diode chip;
a first molding portion covering the light emitting diode chip and having a first index of refraction;
a second molding portion covering the first molding portion and having a second index of refraction,
wherein:
a thickness of an upper side of the second molding portion is less than a thickness of a lateral side of the second molding portion;
the second index of refraction is less than the first index of refraction;
the first molding portion has a flat upper surface and a flat side surface perpendicular to the flat upper surface;
the second molding portion has a flat upper surface and a flat side surface perpendicular to the flat upper surface that cover and directly contact an upper surface and a side surface, respectively, of the first molding portion through conformal coating; and
the second molding portion is formed of a transparent material containing no phosphors.

2. The light emitting diode according to claim 1, wherein the first molding portion covers an upper surface and a side surface of the light emitting diode chip through conformal coating.

3. The light emitting diode according to claim 1, wherein the first molding portion comprises phosphors.

4. The light emitting diode according to claim 3, wherein the phosphors comprise at least one selected from among green phosphors, cyan phosphors, yellow phosphors, and red phosphors.

5. The light emitting diode according to claim 1, wherein one of the first molding portion and the second molding portion is formed of silicone or glass.

6. The light emitting diode according to claim 1, wherein a roughness is formed on an upper surface or a side surface of the second molding portion.

7. The light emitting diode according to claim 1, wherein a roughness is formed on an upper surface or a side surface of the first molding portion.

8. The light emitting diode according to claim 1, wherein an upper side of the first molding portion has the same thickness as a lateral side thereof.

9. The light emitting diode according to claim 1, wherein an upper side of the second molding portion has the same thickness as a lateral side thereof.

10. The light emitting diode according to claim 1, wherein an upper side of the second molding portion has a different thickness than a lateral side thereof.

11. The light emitting diode according to claim 10, wherein the upper side of the second molding portion has a smaller thickness than the lateral side thereof.

12. The light emitting diode according to claim 1, wherein the light emitting diode chip comprises a pair of electrode pads formed on a lower surface thereof.

13. The light emitting diode according to claim 1, wherein the first index of refraction is in a range of about 1.9 to 2.0 and the second index of refraction is about 1.53.

* * * * *